United States Patent
Hoheisel et al.

(10) Patent No.: US 10,568,444 B2
(45) Date of Patent: Feb. 25, 2020

(54) PIECE OF FURNITURE HAVING AT LEAST ONE SUPPORT ROD

(71) Applicant: Dula-Werke Dustmann & Co. GmbH, Dortmund (DE)

(72) Inventors: Stefan Hoheisel, Bergkamen (DE); Alexander Reimer, Dortmund (DE)

(73) Assignee: Dula-Werke Dustmann & Co GmbH, Dortmund (DE)

( * ) Notice: Subject to any disclaimer, the term of this patent is extended or adjusted under 35 U.S.C. 154(b) by 0 days.

(21) Appl. No.: 16/478,483

(22) PCT Filed: Mar. 6, 2018

(86) PCT No.: PCT/EP2018/055447
§ 371 (c)(1),
(2) Date: Jul. 17, 2019

(87) PCT Pub. No.: WO2018/162463
PCT Pub. Date: Sep. 13, 2018

(65) Prior Publication Data
US 2019/0365121 A1    Dec. 5, 2019

(30) Foreign Application Priority Data
Mar. 6, 2017    (DE) .......................... 10 2017 104 587

(51) Int. Cl.
*A47F 7/00*        (2006.01)
*F16B 1/00*        (2006.01)
(Continued)

(52) U.S. Cl.
CPC .................. *A47F 7/00* (2013.01); *F16B 1/00* (2013.01); *H01R 12/714* (2013.01); *H05K 7/02* (2013.01); *F16B 2001/0064* (2013.01)

(58) Field of Classification Search
CPC ...... A47F 7/00; F16B 1/00; F16B 2001/0064; H01R 12/714; H05K 7/02
See application file for complete search history.

(56) References Cited

U.S. PATENT DOCUMENTS 4,203,147 A * 5/1980 Gabr ........................ H05K 7/18
                                                361/721
5,656,942 A * 8/1997 Watts ................. G01R 1/06705
                                                324/750.19
(Continued)

FOREIGN PATENT DOCUMENTS

EP      2499935 A1     9/2012
WO   2005099522 A2    10/2005

OTHER PUBLICATIONS

International Search Report for application No. PCT/EP2018/055447, dated Apr. 18, 2018.
(Continued)

*Primary Examiner* — Pete T Lee
(74) *Attorney, Agent, or Firm* — Oppedahl Patent Law Firm LLC

(57) ABSTRACT

The invention relates to a piece of furniture (30), comprising at least one support rod (10) and at least one first plate (20), on which the support rod or support rods (10) can be installed. The first plate (20) has one or more first openings (21). Into each of said first openings (21), a support rod (10) can be inserted at one end (11) thereof, and each of the support rods (10) can be mounted perpendicular on the first plate (20). The support rod (10) has a star-shaped axially symmetric cross-section (13), which is tapered at the one end (11) facing the first plate (20). The shape of the first openings (21) is adapted to the star-shaped cross-section (13) of the support rod (10), preferably in such a way that the shape of the first openings is designed similarly to the
(Continued)

Figure 1:
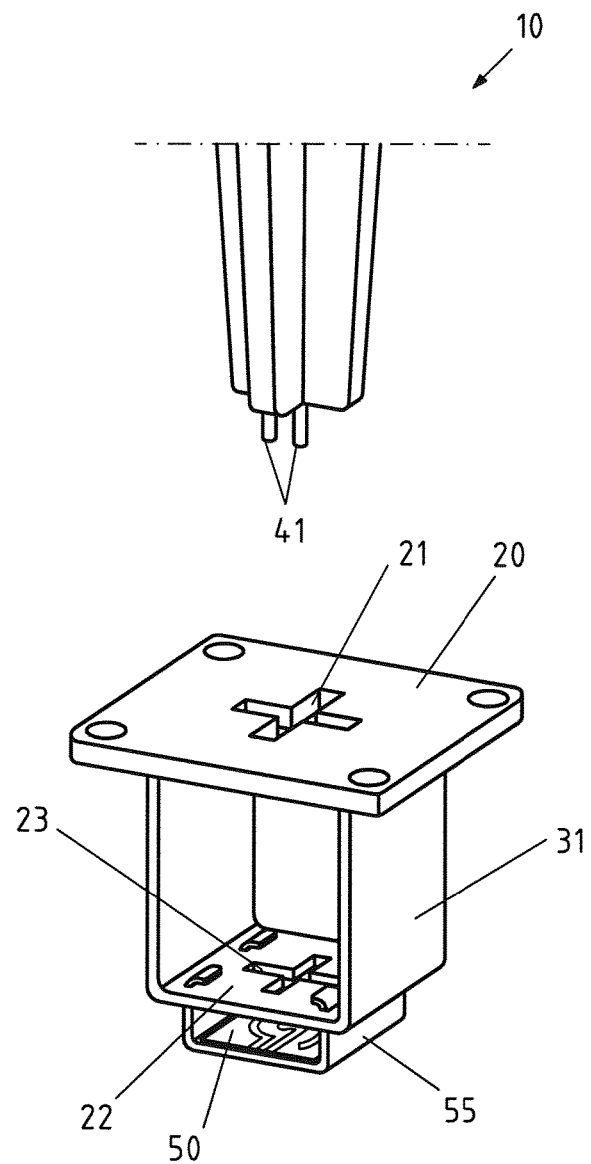

star-shaped cross-section (13) of the support rod (10). Furthermore, at least one second opening (23) is provided, which is located in a second plate (22) parallel to and behind the first opening (21) in the first plate (20) in the insertion direction (15) of the support rod (10), the second opening (23) preferably being similar to but smaller than the first opening (21). The support rod (10) can be inserted by means of the one end (11) thereof into the first opening (21) and into the second opening (23) in a plurality of orientations, which arise by rotation of the support rod (10) about the center axis, the insertion producing a mounted state (30.1). The invention now proposes that the support rod (10) comprises electrical conducting tracks (40), by means of which a load (18), which is provided indirectly or directly on the support rod (10), can be supplied with electrical energy, electrical contact points (41) being provided on the one end (11) of the support rod (10) in order to supply the electrical conducting tracks (40) with electrical energy. Furthermore, a printed circuit board (50) is provided, which has counter electrical contact points (51, 52), which can be brought into operative connection with the electrical contact points (41), the printed circuit board (50) being designed in such a way that the contacting between the electrical contact points (41) and the counter electrical contact points (51, 52) occurs by insertion of the support rod (10) into the first opening (21) and the second opening (23) irrespective of the orientation of the support rod (10).

15 Claims, 7 Drawing Sheets

(51) Int. Cl.
*H01R 12/71* (2011.01)
*H05K 7/02* (2006.01)

(56) References Cited

U.S. PATENT DOCUMENTS

2008/0092782 A1   4/2008   Daniel
2014/0030915 A1*  1/2014   Perrin .................... H01R 24/50
                                                        439/578

OTHER PUBLICATIONS

International Preliminary Report on Patentability, application No. PCT/EP2018/055447, dated Apr. 11, 2019.

* cited by examiner

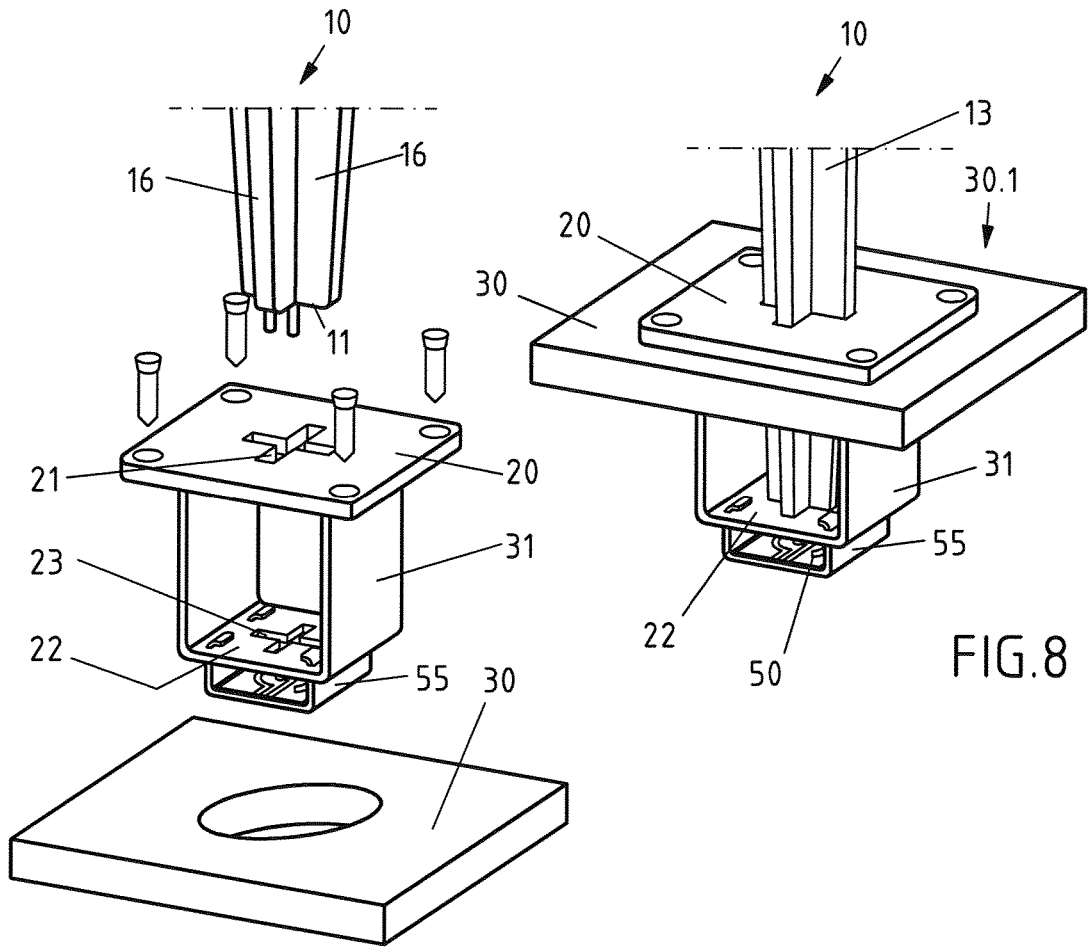
FIG.7
FIG.8
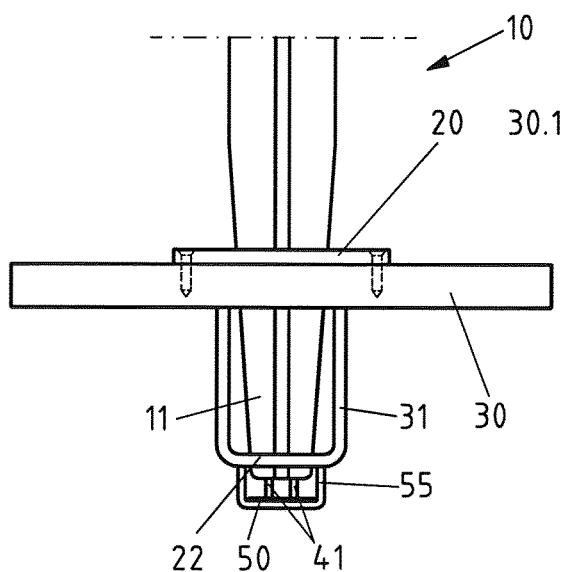
FIG.9

PIECE OF FURNITURE HAVING AT LEAST ONE SUPPORT ROD

The invention relates to a piece of furniture with at least one support rod specified in the preamble of claim 1. Such furniture finds many uses, especially in shopfitting, fairs, and exhibitions, but can also be used in residential and business premises, offices and the like. The support rod is thereby arranged on a plate, wherein on the support rod further elements may be provided, such as goods carriers, decorative elements, informative elements or the like. Such goods carriers can include platforms, suspension arms, clothing rods, hooks and other things.

Such a device is described in EP 2 499 935 A1. Here, an item of furniture is provided with a support rod, wherein at least a first plate having a first recess and a second plate arranged thereunder are provided with a second recess, wherein the one end of the support rod can pass through both recesses to be arranged in the plate. The support rod in this case has a star-shaped cross-section, wherein the two recesses are also formed star-shaped and preferably similar to the cross section of the support rod. A disadvantage of this arrangement is that it is not intended to connect electrical merchandise, such as lighting equipment, displays, speakers, cameras or the like. If such merchandise is desired, the furniture must either be retrofitted with the help of a qualified electrician or the devices must also be connected via sockets and attached to the furniture. This is impractical, however, especially when specialized personnel are required, and the furniture loses much of its flexibility and also of its visual properties.

The object of the invention is therefore to avoid the aforementioned disadvantage and to enhance the furniture to be electrified, which works easily, even if the support rods are mounted and dismounted, in a way that no specialized personnel are required, and without restricting the flexibility of the furniture. This object is solved by the characterizing features of claim 1, which have the following special significance.

The support rod comprises electrical conductors by means of which a piece of merchandise, which is provided directly or indirectly on the support rod, can be supplied with electrical energy. At one end of the support rod electrical contact points are provided to supply electrical conductors with electrical energy. Furthermore, a circuit board is provided, which has electrical mating contact points, which can be brought into operative connection with the electrical contact points. The board is designed so that the contact between the electrical contact points and the electrical mating contact points works regardless of the orientation of the support rod in the recesses.

This results in a simple contact between the electrical contact points and the electrical mating contact points. The board is supplied once during the assembly of the first and second plate in the usual way with electrical energy, for example via a solder joint. If a support rod according to the invention is then introduced into the first and second recesses, the electrical contacting and thus the energy supply of the items of merchandise takes place automatically. This also happens when the support bar is moved from a first pair of recesses to another pair of recesses and is independent of the exact orientation of the axisymmetric support bar. In this way, in the move from one pairs of recesses to another, the energy supply is preserved. The support rods can be plugged into one recess pair and removed again, with the electrical connection automatically made at the same time when plugging in and establishing a new mechanical mounting.

The plates themselves can be fixed to the ground or to a wall. When mounted on the wall, special support rods are used, which have on one side at a point of the star-shaped cross-section a recess with which the support rod can hook in the assembled state of the second recess in the second plate to prevent accidental slipping out. Also, the support rods may still have a projection on the one side facing away from the other side.

A circuit board according to the invention is advantageously designed such that it comprises a central first region which is approximately in the shape of a keyhole and which forms a first electrical mating contact point, while a second region partially surrounding the first region is provided which forms a second electrical mating contact point, wherein the two regions are arranged so that always one electrical contact point of the support rod is in operative connection with the first region and the other electrical contact point of the support rod is in operative connection with the second region, regardless of the orientation of the support rod. Due to the special shape of the board, it is possible to connect both contact areas to the outer edge of the board, from where they can be fed in the usual way by an electrical power supply. Thus, for example, if four insertion directions for the support rod are possible and provided, the keyhole-shaped first portion of the board can be aligned so that the part where the second area does not surround the first area, is aligned at 45 degrees, when the contacting of the board aligns to to 0 degrees, 90 degrees, 180 degrees and 270 degrees. Thus, it can be ensured that the interaction of the electrical contact points and the circuit board does not cause a short circuit, since one contact point always communicates with the first region and the other contact point always communicates with the second region. Of course, other shapes of the board and the support rod are conceivable here.

Preferably, a holder for the board is provided below the second recess. As a result, the board is protected from mechanical stress by the support rods. It is also possible to retrofit an existing piece of furniture which has no electrification, for example by arranging and connecting a holder with a circuit board below the second recess. Then only the support rods must also be retrofitted or replaced by support rods with electrical conductors and already the electrification of the existing furniture can be done.

It is particularly simple if the electrical contact points are designed as a plug-shaped contact receiver, These provide a certain mechanical protection and ensure secure contact of the mating contact points on the board. Advantageously, in this case, the support bar still has a receptacle into which the contact receiver can be introduced. As a result, both the contact and the electrical contact points are additionally protected, since they are virtually introduced into the support rod. Thus, when dismantling and storing the support rods, the electrical contact points are not likely to be damages. In addition, the contact is arranged in the assembled state of the support rod below the first plate and thus not visible from the outside. This results in a good overall appearance of the furniture. The contact receiver simplifies the insertion of the electrical contact points in the first recess.

Preferably, the support bar may be powder coated. This is well-known method and makes it possible to provide a support bar, which has a pleasing appearance and is protected from corrosion and damage. In addition, the powder coating may be in done in various ways, so that a variety of colors and the like are possible.

Particularly inconspicuous is the application of the electrical conductors, when they are printed on the support bar. This is possible with today's standard 3D printing, which also allows the printing of metals or other electrically conductive materials. Alternatively, the electrical conductors can of course be adhered to the support bar. This is particularly useful in a subsequent electrification, when retrofitting an existing support rod. In both methods, it is advantageous if the conductor tracks are formed as flat as possible, so they do not visually stand out and do not disturb the overall visual impression of the support rod.

The support bar itself may consist of several flat components which are put together, in particular with the interposition of one or more images. In this case, the flat components are preferably fixable to each other, in particular by welding, gluing or the like. The flat components can be designed congruent to each other, which simplifies the manufacturing process of the flat components and thus makes them cheaper.

A first embodiment of the piece of furniture provides that a socket is provided, which forms the first and the second plate, each socket having a first and a second recess and a circuit board and a support rod is insertable into the socket, wherein the socket can be arranged in a piece of furniture. Here it is possible to provide pieces of furniture made of all sorts of materials with such a socket and then each uses a support rod in each of the sockets.

In a further embodiment of the furniture, a housing is provided, which forms the first and the second plate, wherein the first plate has a plurality of first recess features and the second plate has a plurality of second recesses features. Preferably, a single board is arranged in the insertion direction below the second recesses in such a way that below each of the second recesses, a pair of mating contact points on the board is present. In each of the first and second recesses in each case a support rod can be introduced, but it depends on the specific application, how many support rods are provided and in which recesses they are introduced. In this way, different numbers of support rods can be arranged arbitrarily in the recesses. The single board requires only one installation or connection to the electrical power supply, and the support bars can be electrically contacted in each pair of recesses by simply plugging in and establishing the mounting state.

In addition, one or more further elements may be integrally formed with a support rod or fixed to this.

According to the invention it is advantageous if the support rod and/or the first plate and/or the second plate and/or the housing and/or the socket entirely or partially made of metal and/or plastic and/or glass and/or consist of a composite material, The exact materials used here are variable and may vary depending on the application. The support rod and/or the first and/or the second plate can at least partially consist of a transparent material which can be illuminated, the lighting already by simply introducing the support rod into the two recesses and contacting with the mating contact points on the board can be supplied with electrical energy.

Figure 2:
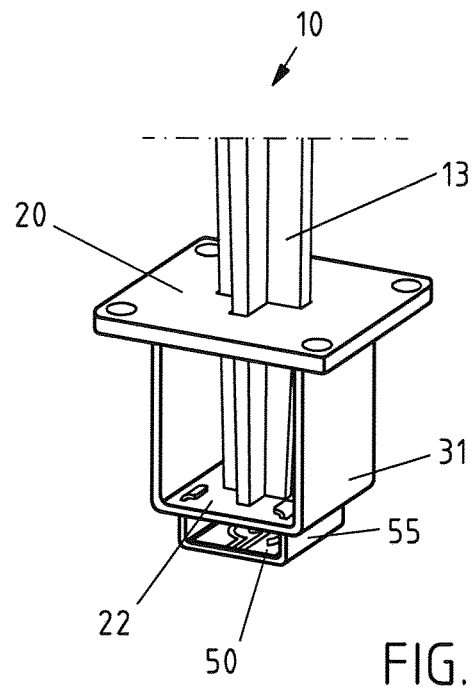
Figure 3:
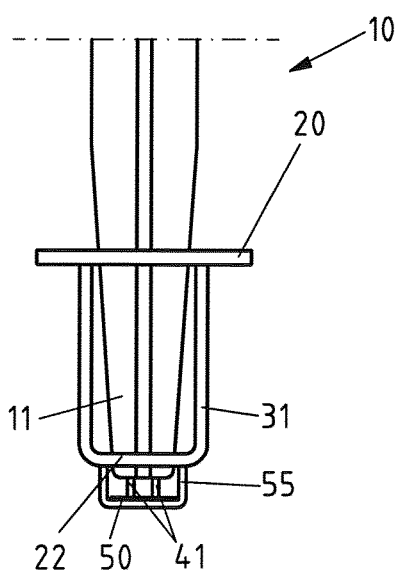
Figure 4:
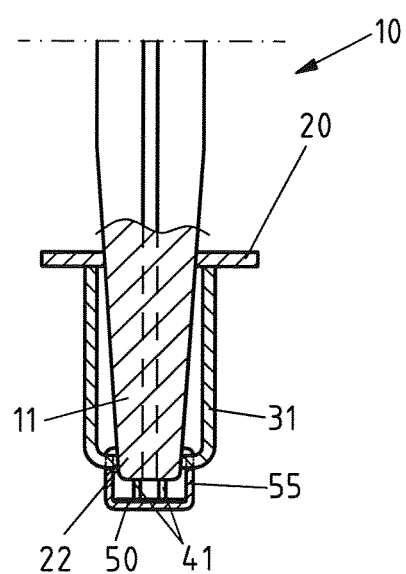

Further advantages and embodiments will become apparent from the following description, the dependent claims and the drawings. In the drawings, the invention is illustrated in two embodiments. They show the following:

FIG. 1: A device according to the invention with a socket, in perspective,
FIG. 2: The device of FIG. 1 in the assembled state,
FIG. 3: The device of FIG. 2 in side view,
FIG. 4: The device of FIG. 2 in section,
FIG. 5: The support rod's contact receiver,
FIG. 6: The socket of FIGS. 1 to 4 with holder and board,
FIG. 7: The socket with the support rod's contact receiver,
FIG. 8: The device according to FIG. 7 in the assembled state, in perspective,
FIG. 9: The device of FIG. 8 in side view,
FIG. 10: An inventive housing in plan view,
FIG. 11: The housing of FIG. 10 with its support rod,
FIG. 12: The elements of FIG. 11 in their assembled state,
FIG. 13a: A housing with exploded board for floor mounting,
FIG. 13b: An exploded housing with a board for wall mounting,
FIG. 14: Fully assembled furniture with goods carriers and housing and two support rods,
FIG. 15: An example of a light source on a support rod.

FIGS. 1 to 4 show a first embodiment of the device according to the invention. The support rod 10 has a star-shaped cross section 13 and is insertable with its one end 11 through a first recess 21 in the first plate 20 and through a second recess 23 arranged parallel to this first recess 23 in the second plate 22. Below the second plate 22, which has the second recess 23, a holder 55 is arranged with a circuit board 50.

The one end 11 of the support rod 10 has a taper 14 and electrical contact points 41. With this taper 14, the support rod 10 engages in the two recesses 21, 23, wherein after penetrating the second recess 23, the electrical contact points 41 with the electrical mating contact points 51, 52 are placed into electrically operative connection with the board 50. The two plates 20, 22 are arranged parallel to each other and parallel to the holder 55 which is aligned with the board 50. The two plates 20, 22 and the holder 55 are arranged so that in this embodiment, the two plates 20 and 22 form a bushing 31, in each of which a first 21 and second recess 23 and a circuit board 50 are arranged. Thus, exactly one support bar 10 can be into in this bushing 31. The support bar 10 itself consists of two flat components 16, which are plugged together and welded together. The support bar 10 shown here has a star-shaped cross section 13 with four prongs. Of course, it is also possible to provide differently shaped star-shaped cross-sections, which have more or fewer teeth. The cross section 13 of the support rod 10 and the two recesses 21, 23 are formed similarly to each other. The electrical conductors 40 are arranged flat on one of the teeth of the support rod 10.

Figure 5:
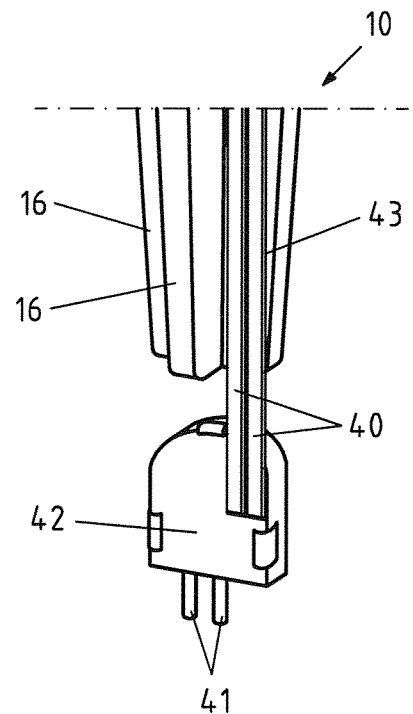

In FIG. 5 it can be seen that at the one end 11 of the support rod 10, a pair of electrical conductor tracks 40 is arranged. These are flat, so that they affect the overall visual impression of the support rod 10 as little as possible. The electrical conductors 40 can either be printed directly on the corresponding sheet-like member 16 of the support rod 10 or glued thereto. It is also possible to attach the electrical conductor tracks 40 to the support rod 10 or the planar component 16 and then to provide a coating, for example a powder coating, so that the electrical conductor tracks 40 are hardly visible or not at all visible.

Furthermore, a groove 43 may be provided on the planar component 16 of the support rod 10, which has the electrical conductor tracks 40, into which a contact receiver 42, which contains the electrical contact points 41, can be accommodated. Also, the contact receiver 42 with the two electrical contact points 41 is shown. This is very small, flat and unobtrusive. The receptacle 43 in the support bar 10 ensures that the contact receiver 42 is placed correctly and thus a proper contact between the electrical conductors 40 and the electrical contact points 41 and the board 50 and the electrical mating contact points 51, 52 is made. Moreover, the contact receiver 42 is optically hidden in the receptacle 43, in particular, since this area is also arranged in the assembled state 30.1 between the first plate and the second plate 22. But the receptacle 43 also ensures that the electrical contact points 41 cannot get caught in the recesses 21, 23 when inserting the support rod 10.

Figure 6:
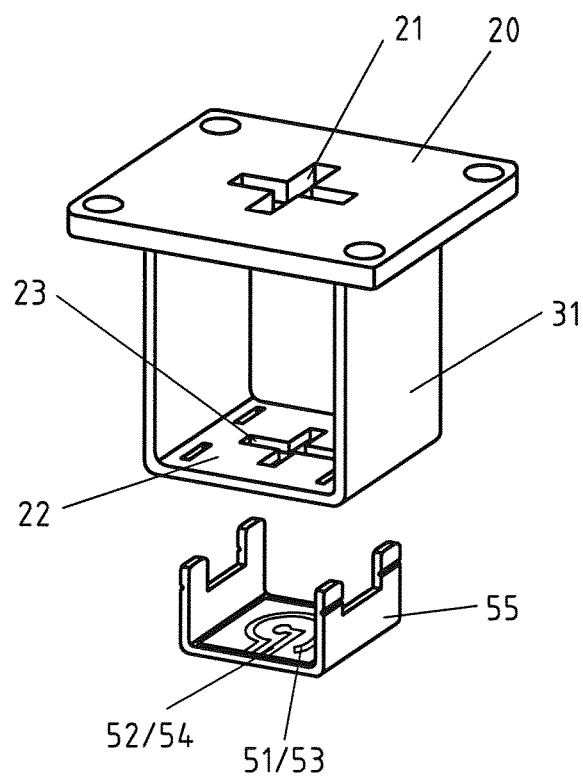

FIG. 6 shows a more detailed structure of the bushing 31 with first plate 20 and second plate 22 and the first receptacle 21 and second receptacle 23 and the circuit board 50 and the holder 55. On the board 50 can be seen the first portion 53, the first electrical mating contact point 51 shape and the second region 54, which forms the second electrical mating contact point 52. Both mating contact points 51, 52 are constructed concentrically to each other, wherein the first region 53 has approximately the shape of a keyhole. Here, the elongated part of the first area 53 of the keyhole is offset by about 45 degrees, so that it cannot come to a short circuit, but in the assembled state 30.1 always the electrical contact points 41 against the electrical mating contact points 51, 52 and make an electrical contact, In FIGS. 7 to 9 it is shown how the bushing 31 is used in a piece of furniture to produce the furniture 30. For this purpose, the bushing 31 is inserted into the piece of furniture and fixed there, preferably by screws. The board 50 then has to be connected with an electrical power supply, for example by a solder connection, to ensure an electrical supply to the tracks 40 and possible light sources 18. Thereafter, it is possible, the support rod 10 arbitrarily in the recesses 21, 23 of the bushing 31 introduce and remove it again. The electrical contact takes place during insertion of the support rod 10 in the recesses 21, 23 thereby automatically.

Figure 10:
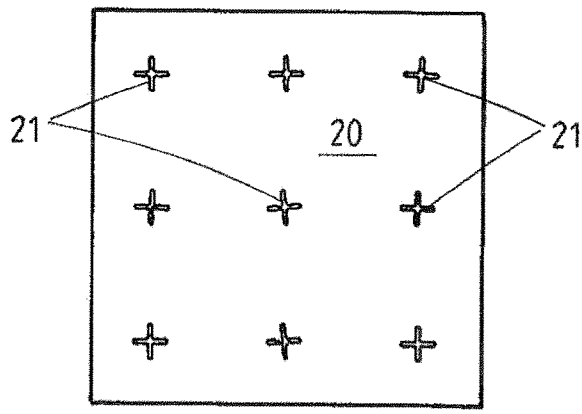
Figure 11:
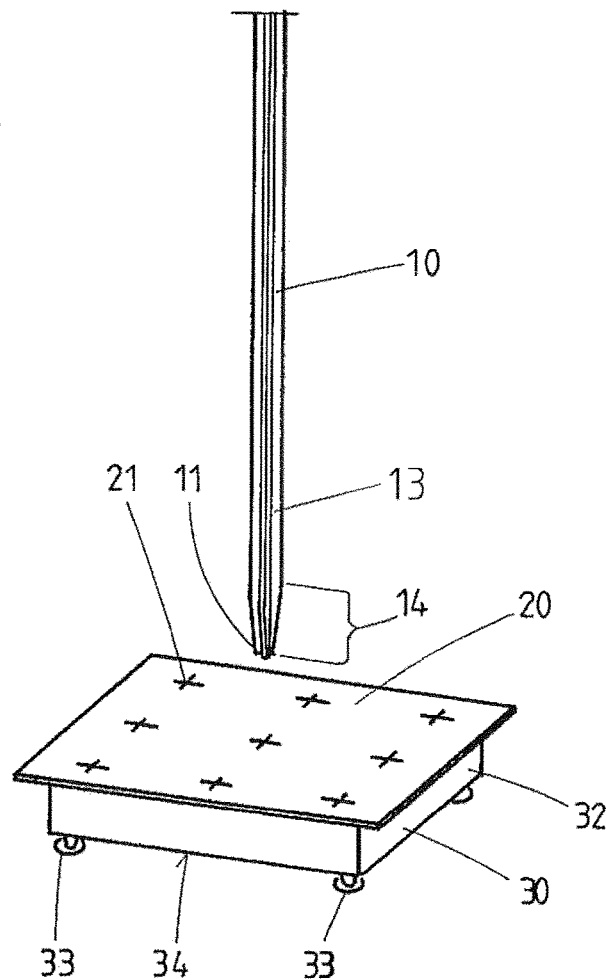
Figure 12:
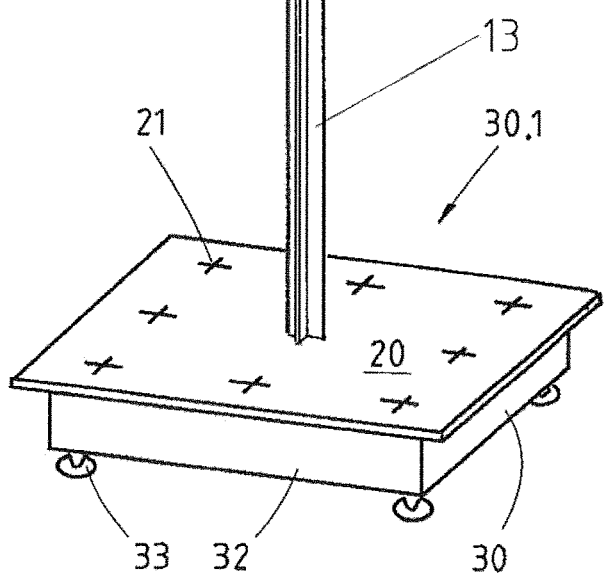

FIGS. 10 to 12 show a further embodiment of the device according to the invention. Here, a housing 32 is provided, which forms the first plate 20 and the second plate 22. Below the second plate 22, the circuit board 50 is then still provided. In the first plate 20 a plurality of first recesses 21 are provided, while the second plate 22 has a plurality of second recesses 23. The circuit board 50 has a plurality of pairs of electrical mating contact points 51, 52, in each case for each pair of recesses 21, 23, a pair of mating contact points 51, 52. The first recesses 21 and second recesses 23 and the mating contact points 51, 52 are in essentially designed as in the figures shown so far. The recesses 21, 23 are again similar to the cross section 13 of the support rod 10 and the electrical mating contact points 51, 52 again have the described first 53 and second regions 54. Since only one board 50 is used for all mating contact points 51, 52, only a single electrical contact must be made to a power supply. The support rod 10 is again in a known manner with its one end 11, which is tapered 14 and has the electrical contact points 41 for the electrical conductors 40, introduced into the first 21 and second recesses 23 and automatically with the mating contact points 51, 52 contacted the board 50.

Figure 13A:
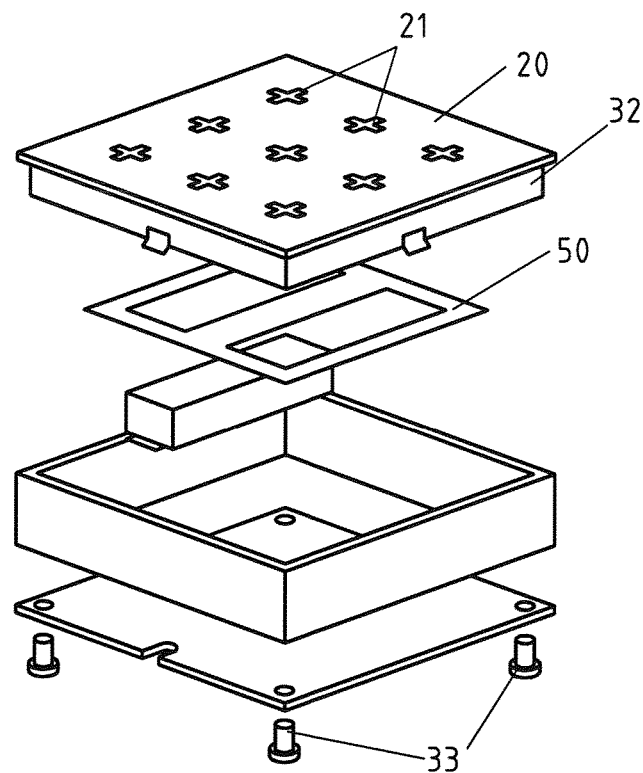
Figure 13B:
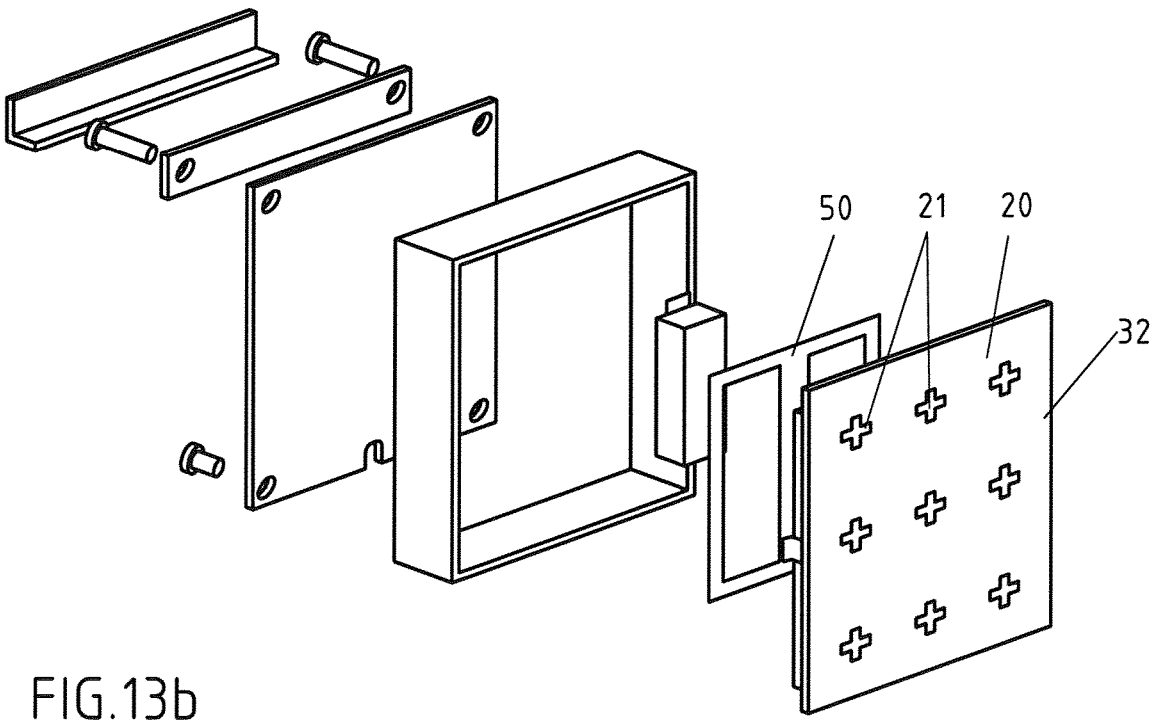

FIGS. 13a and 13b show exploded views of these embodiments. In both figures, the board 50 has been shown only as an example, and the representation of the mating contact points 51, 52 is omitted for reasons of clarity. FIG. 13a shows an exploded view of an inventive furniture 30 with housing 32, which is provided as a floor furniture, so as standing on the floor furniture 30. For this purpose, feet 33 are provided to align the furniture 30 on the floor.

FIG. 13b shows a variant, also with housing 32, wherein this furniture 30 can be mounted on the wall. Thus, the support rods 10 introduced there are then aligned horizontally. Preferably, a support rod 10 provided for this purpose has at one end 11 at a point of its star-shaped cross-section 13 a recess with which they can get caught in the second recess 23. Thus, the support rod 10 does not slip out of the two recesses 21, 23, so that the contact of the electrical contact points 41 and the electrical mating contact points 51, 52 remains.

Figure 14:
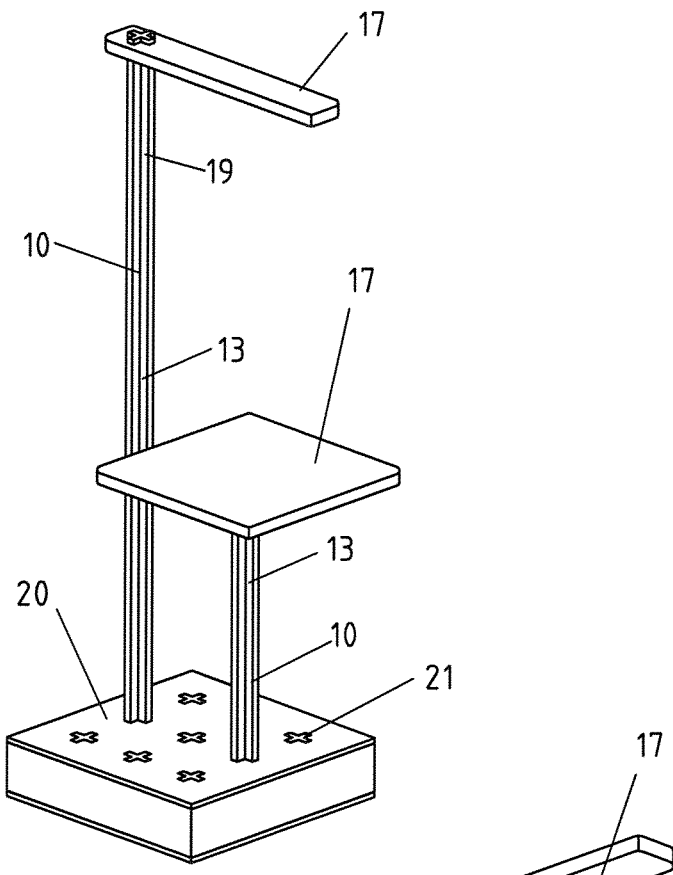

Finally, FIG. 14 shows an exemplary finished furniture 30 with two support rods 10 and with goods carriers. The feet 33 are covered here by a cover, so that there is a nice overall visual picture.

Figure 15:
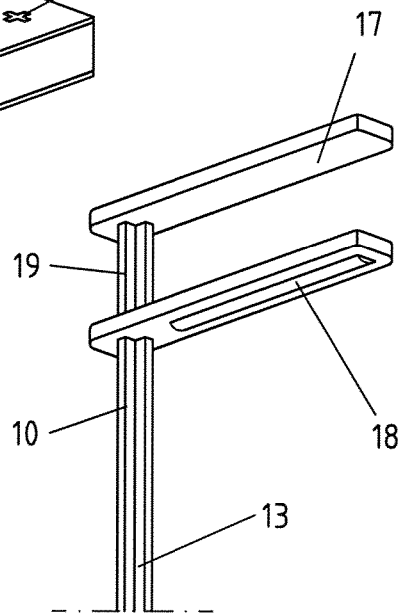

FIG. 15 shows an example of an electrical load 18, here a light source. The light source 18 is arranged at the other end 19 of a support rod 10. For example, the lighting may illuminate goods that are displayed underneath or the like, or serve other lighting purposes.

Finally, it should be pointed out that the embodiments shown here are merely exemplary realizations of the invention. This is not limited to this. On the contrary, modifications and modifications are possible.

REFERENCE SIGN LIST

10 Support bar
11 One end of 10
12 Further element
13 Star-shaped cross-section of 10
14 Rejuvenation at 10
15 Insertion direction of 10
16 Surface component of 10
17 Goods carriers
18 Light source
19 Other end of 10
20 First plate
21 First recess
22 Second plate
23 Second recess
30 Furniture
30.1 Mounting condition
31 Socket
32 housing
33 Feet
34 The floor facing side of 30 or 32
40 Electrical trace
41 Electrical contact points
42 Contact customers
43 Image on 10
50 Board
51 First electrical mating contact point
52 Second electrical mating contact point
53 First area at 50
54 second area at 50
55 Bracket

The invention claimed is:

1. A furniture item (30) having at least one support bar (10) and at least one first panel (20) on which the support bar or support bars (10) can be installed,
   wherein the first plate (20) has one or more first recesses (21), wherein in each of these first recesses (21) a support rod (10) with its one end (11) can be introduced,
   wherein each of the support rods (10) is mountable perpendicular to the first plate (20),
   wherein the support bar (10) has a star-shaped axisymmetric star-section (13) which tapers on the first plate (20) facing one end (11)

and the shape of the first recesses (21) is adapted to the star-shaped star-section (13) of the support rod (10), so that it is similar to the star-shaped star section (13) of the support rod (10), wherein at least one second recess (23) is provided, which in a second plate (22) parallel in the insertion direction (15) of the support rod (10) behind the first recess (21) in the first plate (20) is located wherein the second recess (23) is similar to but smaller than the first recess (21), and wherein the support rod (10) with its one end (11) in the first (21) and in the second recess (23) in a plurality of orientations, which arise by rotation of the support rod (10) about the central axis, can be inserted and thereby an assembly state (30.1) is formed, further characterized in that, the support rod (10) comprises electrical conductor tracks (40) by means of which a consumer (18), which is provided indirectly or directly on the support rod (10), can be supplied with electrical energy, wherein at one end (11) of the support rod (10) electrical contact points (41) are provided to supply the electrical conductor tracks (40) with electrical energy and that a circuit board (50) is provided which has electrical mating contact points (51, 52) which can be brought into operative connection with the electrical contact points (41), wherein the board (50) is such that the contacting between the electrical contact points (41) and the electrical mating contact points (51, 52) takes place, regardless of the orientation of the support rod (10), only by inserting the support rod (10) in in each case into a first (21) and a second recess (23).

2. The furniture item (30) according to claim 1, characterized in that the board (50) has a central first area (53) which is designed in the form of a keyhole and which forms a first electrical mating contact point (51), while a first area (51, 53) is provided, which forms a second electrical mating contact point (52), wherein the two areas are arranged such that always one electrical contact point (41) of the support bar (10) is connected to the first area (53) and the other electrical contact point (41) of the support rod (10) with the second region (54) is in operative connection, regardless of the orientation of the support rod (10).

3. The furniture item (30) of claim 1, characterized in that below the second recess (23) a holder (55) for the board (50) is provided.

4. The furniture item (30) of claim 1, characterized in that the electrical contact points (41) are designed as a plug-shaped contact receiver (42).

5. The furniture item (30) of claim 4, characterized in that the support rod (10) has a receptacle (43), in which the contact receiver (42) can be introduced.

6. The furniture item (30) of claim 1, characterized in that the support rod (10) is powder-coated.

7. The furniture item (30) of claim 1, characterized in that the electrical conductor tracks (40) are printed on the support rod (10).

8. The furniture item (30) of claim 1, characterized in that the electrical conductor tracks (40) are glued to the support rod (10).

9. The furniture item (30) of claim 1, characterized in that the support rod (10) of a plurality of mutually congruent flat components (16) can be produced by plugging together, in particular with the interposition of one or more images, wherein the flat components (16) are fixable to each other.

10. The furniture item (30) of claim 1, characterized in that a bushing (31) is provided, which forms the first (20) and the second plate (22), wherein the bush (31) via a respective first (21) and a second recess (23) and a circuit board (50) and a support rod (10) in the socket (31) can be introduced and wherein the socket (31) can be arranged in a piece of furniture.

11. The furniture item (30) of claim 1, characterized in that a housing (32) is provided, which forms the first (20) and the second plate (22), wherein the first plate (20) over a plurality of first (20) (21) and the second plate (22) has a plurality of second recesses (23), wherein a single board (50) in the insertion direction (15) below the second recesses (23) is arranged in such a manner that below each of the second recesses (23) a pair of mating contact points (51, 52) on the board (50) is available and wherein in the first (21) and second recesses (23) in principle in each case a support rod (10) can be introduced, but in the specific application, the number and arrangement of the support rods used (10) may be different.

12. The furniture item (30) of claim 1, characterized in that one or more further elements (12) are integrally formed with the support rod (10) and/or can be fixed thereto.

13. The furniture item (30) of claim 1, characterized in that the furniture (30) can be mounted on a vertical wall, wherein the support rod (10) at its one end (11) at a point of the star-shaped star section (13) has a recess, which is then introduced into the second recess (23) so that it is oriented upwards and hooked in the assembled state (30.1) in the second recess (23).

14. The furniture item (30) of claim 1, characterized in that the support rod (10) and/or the first plate (20) and/or the second plate (22) and/or the housing (32) and or the bushing (31) wholly or partly made of metal and/or plastic and/or glass and/or consist of a composite material.

15. The furniture item (30) of claim 1, characterized in that the support rod (10) and/or the first plate (20) and/or the second plate (22) are at least partially made from a transparent material through which light can pass.

* * * * *